United States Patent
Gasiba et al.

(10) Patent No.: US 11,362,762 B2
(45) Date of Patent: Jun. 14, 2022

(54) METHOD AND SYSTEM FOR THE ERROR-CORRECTING TRANSMISSION OF A DATA RECORD VIA A UNIDIRECTIONAL COMMUNICATION UNIT

(71) Applicant: Siemens Mobility GmbH, Munich (DE)

(72) Inventors: Tiago Gasiba, Munich (DE); Matthias Seifert, Buchholz (DE); Martin Wimmer, Neubiberg (DE)

(73) Assignee: SIEMENS MOBILITY GMBH, Munich (DE)

( * ) Notice: Subject to any disclaimer, the term of this patent is extended or adjusted under 35 U.S.C. 154(b) by 0 days.

(21) Appl. No.: 15/734,766

(22) PCT Filed: May 31, 2019

(86) PCT No.: PCT/EP2019/064208
§ 371 (c)(1),
(2) Date: Dec. 3, 2020

(87) PCT Pub. No.: WO2019/233897
PCT Pub. Date: Dec. 12, 2019

(65) Prior Publication Data
US 2021/0234633 A1     Jul. 29, 2021

(30) Foreign Application Priority Data
Jun. 6, 2018   (DE) .................. 10 2018 208 962.0

(51) Int. Cl.
*H04L 1/00* (2006.01)
*H04L 1/22* (2006.01)

(52) U.S. Cl.
CPC .......... *H04L 1/0047* (2013.01); *H04L 1/0041* (2013.01); *H04L 1/0075* (2013.01); *H04L 1/22* (2013.01)

(58) Field of Classification Search
CPC ... H04L 1/0047; H04L 1/0041; H04L 1/0075; H04L 1/22; H04L 1/004; H03M 13/00
See application file for complete search history.

(56) References Cited

U.S. PATENT DOCUMENTS

| | | | |
|---|---|---|---|
| 9,397,790 B2 * | 7/2016 | Baek | H04L 63/18 |
| 2004/0164990 A1 * | 8/2004 | Chan | G06F 3/14 |
| | | | 345/581 |

(Continued)

FOREIGN PATENT DOCUMENTS

| | | |
|---|---|---|
| DE | 102015200279 A1 | 7/2016 |
| DE | 102015205833 A1 | 10/2016 |

OTHER PUBLICATIONS

Austin Scott: "Interested in learning more about cyber security training? Tactical Data Diodes in Industrial Automation and Control Systems"; XP055550479, Gefunden im Internet: URL:https://www.sans.org/reading-room/whitepapers/firewalls/tactical-data-diodes-industrial-automation-control-systems-36057; [gefunden am Feb. 1, 2019]; the whole document; 2015; 32 pages.

(Continued)

*Primary Examiner* — Thien Nguyen
(74) *Attorney, Agent, or Firm* — Schmeiser, Olsen & Watts LLP

(57) ABSTRACT

A method and a system for fault-correcting transfer of a dataset from a first network into a second network via a unidirectional communication unit, the receiving apparatus having a limited computing and main memory capacity is provided. The dataset is divided into partial datasets and are each coded by adding at least one correction mark. The marks and correction marks are decoded repeatedly in the second network, wherein marks and correction marks associated with a first encoded partial dataset are stored in a main memory, marks and correction marks associated with other encoded partial datasets are buffered in a background (Continued)

Figure 1:
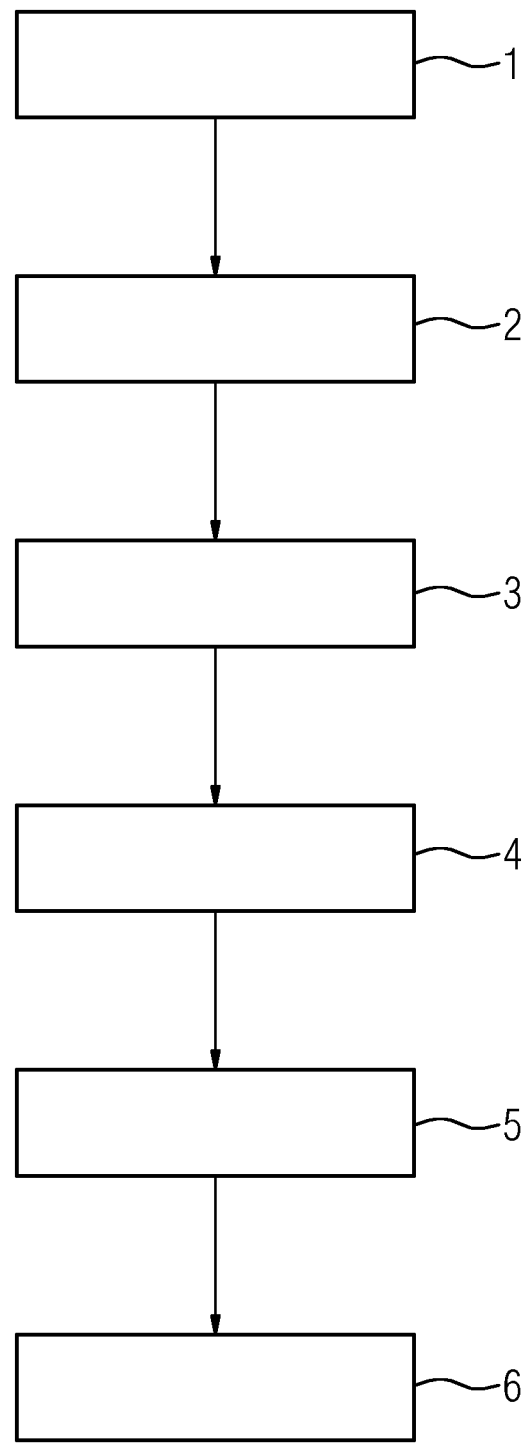

memory, and the first coded partial dataset is decoded, and then the previously received marks and/or correction marks of one of the other coded partial datasets are shifted from the background memory into the main memory. The dataset is reproduced from the decoded partial datasets in the second network.

13 Claims, 3 Drawing Sheets

(56) References Cited

U.S. PATENT DOCUMENTS

| | | | |
|---|---|---|---|
| 2009/0006765 A1 | 1/2009 | Friedman et al. | |
| 2012/0195479 A1* | 8/2012 | Ellis | H04N 1/00204 382/128 |
| 2018/0109356 A1* | 4/2018 | Kim | H04L 43/0835 |
| 2018/0124121 A1 | 5/2018 | Uwe et al. | |
| 2018/0276399 A1* | 9/2018 | Hakamata | G06F 21/6227 |
| 2020/0412731 A1* | 12/2020 | Gulbrandsen | G06F 21/64 |

OTHER PUBLICATIONS

Watson Netflix Met Al: "Forward Error correction (FEC) FrameworK; rtc6363.txt"; Forward Error Correction (FEC) Framework; RFC6363. TXT, Internet Engineering Task Force, IETF; Standard, Internet Society (ISOC) 4, Rue Des Falaises CH-1205 Geneva, Switzerland, pp. 1-42; XP015081311, 1-42, XP015081311, [gefunden am Oct. 15, 2011]; capture 1-5; 2011; 42 pages.

International Search Report and Written Opinion for corresponding PCT Patent Application No. PCT/EP2019/064208 dated Sep. 13, 2019. 15 pages.

Search Report in German Patent Application No. DE 10 2018 208 962.0 dated Apr. 4, 2019. 5 pages.

* cited by examiner

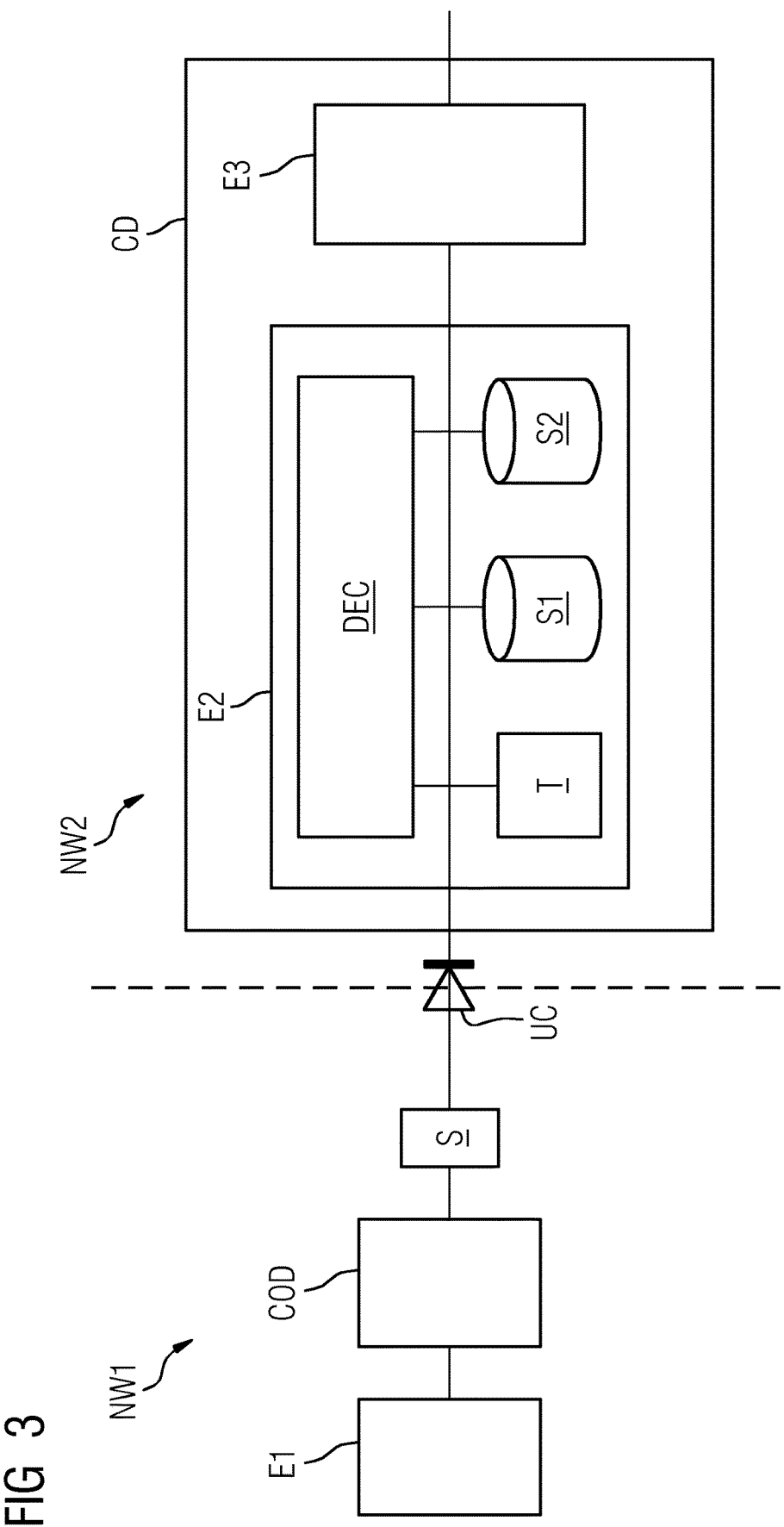

METHOD AND SYSTEM FOR THE ERROR-CORRECTING TRANSMISSION OF A DATA RECORD VIA A UNIDIRECTIONAL COMMUNICATION UNIT

CROSS-REFERENCE TO RELATED APPLICATIONS

This application claims priority to PCT Application No. PCT/EP2019/064208, having a filing date of May 31, 2019, which is based off of German Patent Application No. 10 2018 208 962.0, having a filing date of Jun. 6, 2018, the entire contents both of which are hereby incorporated by reference.

FIELD OF TECHNOLOGY

The following relates to a method and a system for the error-correcting transmission of a data record from a first network, such as e.g. a safety-critical industrial network, to a second network, such as e.g. a diagnosis network or office network, via a unidirectional communication unit, wherein a receiving device in the second network has in particular just a limited computing and main-memory capacity.

BACKGROUND

Industrial data and communication networks may be realized in particular as isolated networks on account of safety regulations, i.e. data transfer into the network is usually not permitted and/or possible. Additionally, safety-critical networks are often not connected to open networks, such as e.g. to office networks or the Internet.

Nevertheless, specific applications, such as for example a central state monitoring system or error analyses, require data of systems to be able to be transmitted from a closed network to an open network. A data transfer often takes place strictly unidirectionally in this case, i.e. data can be transmitted only from the closed network to another network. A flow of information in only one direction can be achieved by means of a data diode, for example, the data transfer in this instance usually not being resistant to data losses on the communication link.

Data transmission via unidirectional network paths is typically effected by means of User Datagram Protocol, UDP for short, which affords no error correction on the protocol layer, i.e. a receiving component cannot convey feedback about the state of a received network packet to a transmitting component. Protection and correction for a data transfer link are frequently achieved using a forward error correction (FEC) method, which deliberately incorporates redundancies e.g. in order to compensate for an incomplete data transfer. This increases transfer volumes, however, and known forward error correction methods usually require the coded data obtained to be able to be held in the main memory of a receiving device until decoding. This is a problem in particular for devices with limited computing and main-memory capacity, also referred to as (resource) constrained devices.

SUMMARY

An aspect relates to a unidirectional data transfer, protected by means of a forward error correction method, to a device having limited computing and main-memory capacity.

An aspect relates to a method, a system, a computer program product (non-transitory computer readable storage medium having instructions, which when executed by a processor, perform actions) and a data carrier.

An aspect of the present invention relates to a method for the error-correcting transmission of a data record from a first network to a second network via a unidirectional communication unit, having the method steps of:

dividing the data record into data subrecords in the first network, wherein a data subrecord comprises at least one respective character, coding the data subrecords by adding at least one correction character to each of the data subrecords, transmitting the characters and correction characters of the coded data subrecords from the first network to a receiving unit in the second network via the unidirectional communication unit, receiving the characters and correction characters of the coded data subrecords in the second network, decoding the coded data subrecords, wherein a) characters and correction characters assigned to a first coded data subrecord are stored in a main memory, b) characters and correction characters assigned to other coded data subrecords are buffer-stored in a background memory, and c) the first coded data subrecord is decoded and subsequently the previously received characters and/or correction characters of one of the other coded data subrecords are moved from the background memory to the main memory, wherein steps a) to c) are performed iteratively for each of the coded data subrecords of the data record, and restoring the data record from the decoded data subrecords in the second network.

Coding within the context of the present invention can be understood to mean in particular error coding. On the basis of correction characters respectively attributable to at least one of the characters of a data record or a correction character attributable to one of the characters of a data subrecord, an error coding can be used to still perform a decoding in the event of an incomplete transmission of characters. A data record can, in particular, be divided into at least one data subrecord. Correction characters can also be referred to as redundancy. A decoding of a data subrecord can be effected in particular if a quantity of characters and/or correction characters that are sufficient for a decoding has been received. As soon as all of the data subrecords are available in decoded form, the data record can be restored in the second network.

A first network can be understood to mean in particular a safety-critical network, such as e.g. an industrial network, and a second network can be understood to mean in particular an open network. A data record, divided into coded data subrecords, is in particular conveyed from the first network to the second network via a unidirectional communication unit. The unidirectional communication unit ensures the decoupling.

The method according to the embodiment of the present invention can, in particular, allow a unidirectional data transfer, wherein data are conveyed in coded form, to a device having limited main-memory and computing capacity, such as e.g. a component in an industrial network. A data record can be conveyed to the second network in steps as single error-coded data subrecords and iteratively decoded there. A first coded data subrecord does not necessarily have to be the first portion of a data record, but rather can be a first from the quantity of data subrecords of a data record. Any number of correction characters can be added for the purpose of error correction. The number of data subrecords into which a data record is divided may, in particular, be chosen arbitrarily.

It is also an advantage of the embodiment of the present invention that just characters and/or correction characters of one of the data subrecords are held in the main memory and decoded there. The characters and/or correction characters of the other data subrecords are buffer-stored on a background memory following reception. As such, a decoding can be effected in the main memory, e.g. of a receiving device having limited storage space, in particular in steps. As soon as for example one data subrecord is decodable in the main memory, an interchange of the characters and/or correction characters of another data subrecord can be effected from the background memory to the main memory. Depending on the storage and computing capacity of the main memory, it is also possible for more than one first coded data subrecord to be able to be stored and decoded in the main memory.

In one advantageous embodiment of the method, characters and correction characters of the coded data subrecords can be conveyed in each case individually and/or in any order and/or independently of an assignment to one of the coded data subrecords.

A transmission of a data record via the unidirectional communication unit can, in particular, be effected via UDP and independently of an order or assignment. It is advantageous in this case that the decoding at the receiver is independent of the order of transmission of the characters and/or correction characters or assignment to a data record.

In one advantageous embodiment of the method, characters and/or correction characters assigned to a second coded data subrecord can be moved from the background memory to the main memory as soon as
- a complete quantity of characters and/or correction characters for decoding is available in the main memory for the first coded data subrecord stored in the main memory or
- a larger quantity of characters and/or correction characters is available for the second coded data subrecord than for the first coded data subrecord, wherein the previously received characters and/or correction characters of the first coded data subrecord are moved to the background memory.

It is advantageous to perform the iterative decoding of the data subrecords depending on the quantity of received characters and/or correction characters per data subrecord. Therefore, in particular that data subrecord for which the largest quantity of characters and/or correction characters is available, i.e. has already been received, is stored in the main memory and then decoded first. The selection of the data subrecord for which received characters and/or correction characters are stored in the main memory can, in particular, also be determined by a probability calculation, depending on the order and/or rate of characters and/or correction characters of a data subrecord. As soon as a quantity of characters and/or correction characters that is necessary for a decoding is available for one coded data subrecord, this coded data subrecord can be decoded. Characters and/or correction characters of another, second coded data subrecord can subsequently be moved from the background memory to the main memory. Alternatively, a quantity of characters and/or correction characters of a coded data subrecord can be moved from the background memory to the main memory if for example more characters and/or correction characters are available therefor, and hence this data subrecord can be decoded more quickly, than for the data subrecord in the main memory. The characters and/or correction characters of the data subrecords can therefore be moved from the main memory to the background memory, and vice versa. This allows efficient decoding and memory management to be achieved, since the characters and/or correction characters of a data subrecord that are not needed for decoding can be moved to the background memory following reception.

In one advantageous embodiment of the method, the received characters and/or correction characters in the second network can be managed by means of a management unit and this makes it possible to determine which characters and/or correction characters are stored for a coded data subrecord in the main memory.

A management unit, in particular a table, can be used to manage, i.e. in particular organize and assign to a data subrecord, the characters and/or correction characters received on a device in the second network. The management unit comprises in particular information about the characters and/or correction characters, such as e.g. time of reception, order and assignment to an applicable data subrecord.

In one advantageous embodiment of the method, the management unit can be used to ascertain that coded data subrecord for which the largest quantity of received characters and/or correction characters is available, and the received characters and/or correction characters of this coded data subrecord can be stored in the main memory.

On the basis of the information stored in the management unit, e.g. a table, such as e.g. the number of received characters and/or correction characters of a coded data subrecord, it is possible to ascertain the coded data subrecord for which a complete or almost complete quantity of characters and/or correction characters is available for decoding. Characters and/or correction characters of this data subrecord are held in the main memory. By way of example, an index in a table can indicate the number of received characters and/or correction characters for a coded data subrecord held in the main memory.

In one advantageous embodiment of the method, the management unit can be used to ascertain the quantity of received characters and/or correction characters of a coded data subrecord and to determine from the ascertained quantity the completeness for a decoding of a coded data subrecord.

On the basis of the information stored in the management unit it is possible in particular to determine whether a sufficient quantity of characters and/or correction characters for a decoding has already been received in the second network for a coded data subrecord.

In one advantageous embodiment of the method, information of the management unit can be updated when a character and/or correction character is received in the second network.

The management unit is updated at the reception end when a further character and/or correction character is received, wherein in particular an assignment to a data subrecord is made. By way of example, an index of a table can be incremented as appropriate.

In one advantageous embodiment of the method, the coding of the data subrecords in the first network is effected by means of a stipulated forward error correction method.

In one advantageous embodiment of the method, the decoding of the data subrecords in the second network is effected according to the stipulated forward error correction method.

A forward error correction method, also referred to as FEC for short, can in particular stipulate a number of correction characters, such as e.g. reconstruction data. Methods for forward error correction are trellis coding and the Reed-Solomon code, inter alia.

A further aspect of the present invention relates to a system for the error-correcting transmission of a data record from a first network to a second network via a unidirectional communication unit, comprising:

a dividing unit designed to divide the data record in the first network into data subrecords, wherein a data subrecord comprises at least one respective character,
a coding unit in the first network, designed to code the data subrecords by adding at least one correction character to each of the data subrecords,
a unidirectional communication unit designed to transmit the characters and correction characters of the coded data subrecords from the first network to a receiving unit in the second network,
the receiving unit in the second network, designed to receive the characters and correction characters of the coded data subrecords, wherein the receiving unit comprises a main memory, a background memory and a decoding unit for decoding the coded data subrecords, wherein
a) characters and correction characters assigned to a first coded data subrecord are stored in the main memory,
b) characters and correction characters assigned to other coded data subrecords are buffer-stored in the background memory,
c) the first coded data subrecord is decoded and subsequently the previously received characters and/or correction characters of one of the other coded data subrecords are moved from the background memory to the main memory,
wherein steps a) to c) are performed iteratively for each of the coded data subrecords of the data record, and
a restoring unit designed to restore the data record from the decoded data subrecords in the second network.

The dividing unit for dividing a data record into data subrecords and the coding unit are in particular integrated in or coupled to a device in the first network. The decoding unit, the main memory, the background memory and the restoring unit may be coupled to one another, for example, wherein in particular the decoding unit, the main memory and the background memory may be integrated in the receiving unit. The main memory and/or the background memory may also be in the form of part of the decoding unit. The receiving unit, the decoding unit, the main memory, the background memory and the restoring unit may, in particular, be part of a device in the second network, said device having just a limited computing and main-memory capacity.

In one advantageous embodiment, the system comprises a management unit for managing the received characters and/or correction characters in the second network.

The management unit may, in particular, be in the form of a table in the receiving unit or the main memory and may be coupled to or stored in the decoding unit.

In addition, the embodiment of the present invention relates to a computer program product loadable directly into a programmable computer, comprising program code parts suitable for performing the steps of a method according to the present invention, and to a data carrier that stores the computer program product.

BRIEF DESCRIPTION

Figure 2:
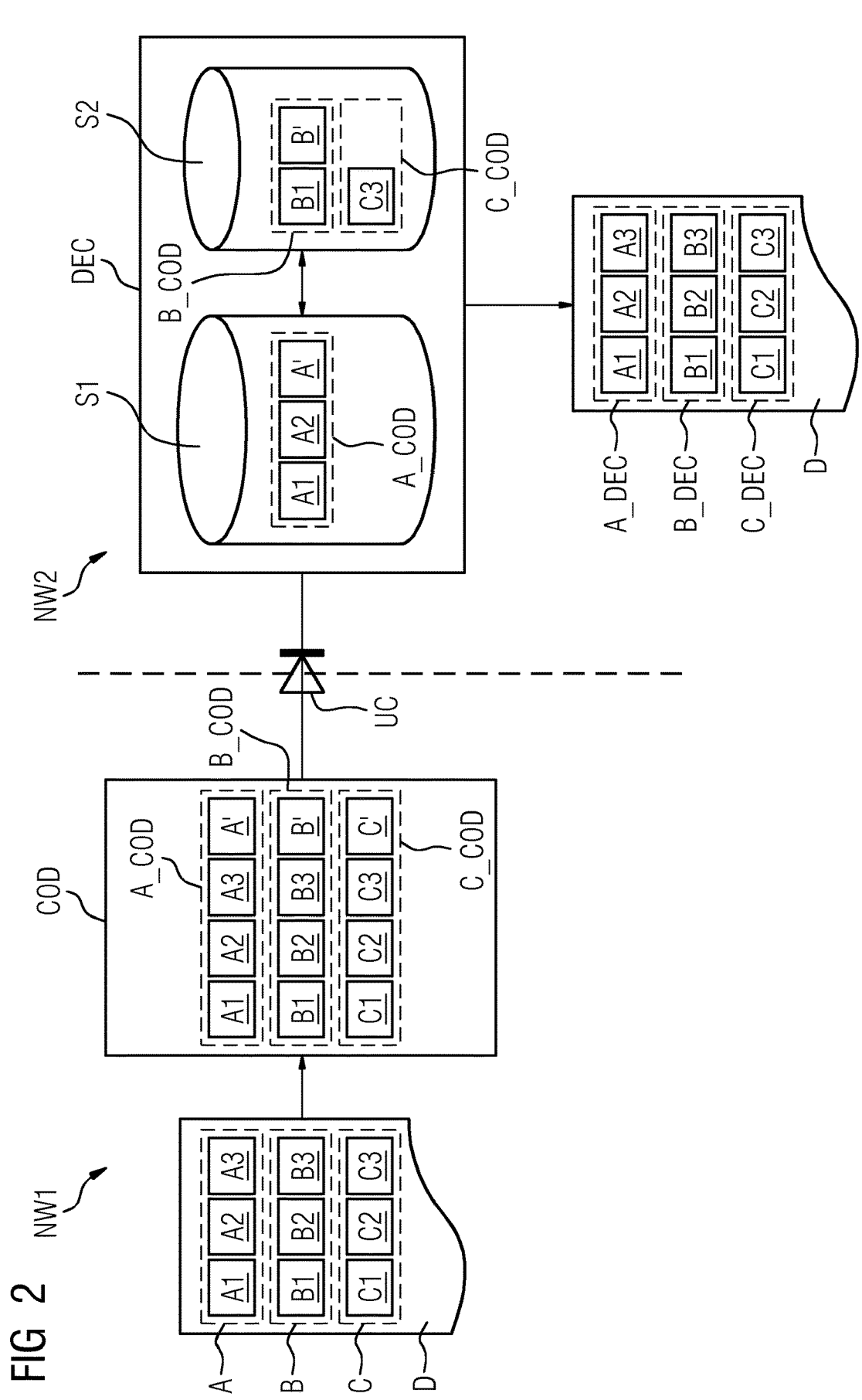

Some of the embodiments will be described in detail, with reference to the following figures, wherein like designations denote like members, wherein:
FIG. 1 depicts a flowchart for a method;
FIG. 2 depicts a schematic depiction of a method; and
FIG. 3 depicts a schematic depiction of a system.

DETAILED DESCRIPTION

Mutually corresponding items are provided with the same reference signs in all of the figures.

FIG. 1 shows a schematic depiction of the steps of a method according to the embodiment of the present invention for the error-correcting transmission of a data record from a first network to a second network via a unidirectional communication unit. The data transfer based on the method according to the present invention is in particular decoupled, i.e. a data transmission is effected only unidirectionally from the first network to the second network. In particular a device having limited main memory, such as e.g. a field device, can be used at the reception end.

In step 1 a data record is captured on a device in the first network, such as e.g. a safety-critical network of an industrial installation, and divided into data subrecords. By way of example, this involves measurement data that are supposed to be conveyed for diagnosis purposes to a second network, such as e.g. a diagnosis network. Safety regulations mean that the data transfer from the first network to the second network is effected via a unidirectional and hence decoupled communication unit. To send a data record, the data record is divided into individual data subrecords and transmitted by means of UDP. The data subrecord comprises at least one character of the data record.

In step 2 the data subrecords are coded, in particular error coded. To this end, each data subrecord has at least one correction character added, wherein a correction character is in particular the same as a character of the applicable data subrecord and/or can be ascertained by means of probability calculations. Redundancy is therefore incorporated according to a stipulated forward error correction method. This allows the transmitted data record to be completely restored at the reception end in the event of data losses during the transmission, for example. Feedback from the receiver component to the transmitting component is therefore not necessary.

In step 3 the coded data subrecords are transmitted via the unidirectional communication unit, i.e. are conveyed from a transmitting unit of a device in the first network to a receiving unit in the second network. The conveyance is effected in particular by means of User Datagram Protocol, UDP for short. The characters and/or correction characters of the individual data subrecords are conveyed via the unidirectional communication unit in individual data packets and in any order.

In step 4 the characters and/or correction characters are received by a receiving unit in the second network. They are available in no particular order there, for example. A management unit, in particular a table, can be used to manage the time of reception, the order of the received characters and/or correction characters and the assignment thereof to one of the data subrecords. From the table it is possible to ascertain in particular a first data subrecord for which characters and/or correction characters are stored in the main memory of the receiving unit. Characters and/or correction characters of other data subrecords can be managed by means of the table and are buffer-stored in the background memory.

In step 5 the received coded data subrecords are decoded. This requires a sufficient number of characters and/or correction characters of a data subrecord to be available. In particular, a complete quantity of characters of a data subrecord does not necessarily have to be available, for example if sufficient correction characters for a decoding have been received. The received characters and/or correction characters are first stored either on the main memory or on the background memory, depending on their assignment to a data subrecord. By way of example, characters and/or correction characters of a first data subrecord are stored in the main memory and characters and/or correction characters of the other data subrecords are stored in the background memory. As soon as the first coded data subrecord is available completely for decoding in the main memory, it is decoded. Characters and/or correction characters of one of the other coded data subrecords are subsequently moved from the background memory to the main memory. The procedure is performed iteratively until all of the data subrecords are available in the receiving unit in decoded form, so that, in step 6, the transferred data record can be restored therefrom. The data record can subsequently be processed further or used in the second network.

FIG. 2 schematically shows the flow of a method according to the embodiment of the present invention. The first network NW1 and the second network NW2 are shown, these being connected by a unidirectional communication unit UC, i.e. just a data transfer from the first network NW1 to the second network NW2 can be effected. The data transmission of a data record D is effected, according to the present invention, by means of error coding of the data record D, which means that possible data losses during the transmission can be compensated for.

In the first network NW1 a data record D for conveyance to the second network NW2 is divided into data subrecords A, B, C that each consist of characters A1, A2, A3, . . . , C3. The number of data subrecords and characters, three data subrecords A, B, C being shown by way of illustration in this instance, may be chosen or varied arbitrarily, i.e. in particular does not have to be equal to three, and is dependent on the stipulated forward error correction method, the transfer rate and/or data packet size. The data subrecords are coded in a coding unit COD. To this end, each data subrecord has at least one correction character A', B', C' added. The coded data record therefore comprises the coded data subrecords A_COD, B_COD, C_COD. The number of coded data subrecords is dependent on the number of data subrecords and is indicated by three in this instance merely by way of illustration.

The coded data subrecords A_COD, B_COD, C_COD are transmitted to the second network NW2 via the unidirectional communication unit UC. The transmission is effected by UDP, the characters and/or correction characters being transferred as data packets depending on a size of a network packet. The transmission of the characters and/or correction characters is effected independently of their order and/or assignment to a data subrecord. In particular, the transmission is usually not effected per data subrecord, which means that the characters and/or correction characters may be available at the receiver in unordered form.

According to the embodiment of the present invention the characters and/or correction characters are stored on a main memory S1 or on a background memory S2, which may each be part of the decoding unit DEC. The main memory S1 and the background memory S2 may also be coupled to the decoding unit or configured so as to be integrated therein, as shown by way of illustration in FIG. 3. For example characters and/or correction characters A1, A2, A' of a first data subrecord A_COD are stored in the main memory. In particular a first coded data subrecord A_COD for which the largest quantity of received characters and/or correction characters is available and for which further received characters and/or correction characters are stored in the main memory is determined. The received characters and/or coded correction characters B1, B', C3 of other coded data subrecords B_COD, C_COD are meanwhile buffer-stored in the background memory.

A decoding in the second network NW2 requires sufficient characters and/or correction characters of a data subrecord A_COD, B_COD, C_COD, according to the stipulated error correction method, to be available. An interchange of characters and/or correction characters between the main memory S1 and the background memory S2 can be effected as soon as the first data subrecord A_COD can be decoded or as soon as more characters and/or correction characters are available in the background memory for another data subrecord B_COD, C_COD. The received characters and/or correction characters can be managed by means of a management unit, such as e.g. a table. From the table it is possible to efficiently ascertain when an interchange of characters and/or correction characters between the main and background memories S1, S2 can be effected.

As soon as all of the coded data subrecords A_COD, B_COD, C_COD are available completely for decoding, they are decoded and the data record D can be restored from these decoded data subrecords A_DEC, B_DEC, C_DEC.

FIG. 3 shows a system according to the embodiment of the present invention for the error-correcting transmission of a data record from a first network to a second network via a unidirectional communication unit by way of illustration.

The first network NW1 may be a safety-critical industrial network, for example, and the second network NW2 may be an open office network, for example. The networks NW1 and NW2 are connected to one another merely via a one-way communication unit UC.

The system comprises, in the first network NW1, a dividing unit E1 for dividing the data record into data subrecords and a coding unit COD, for coding the data subrecords by adding at least one correction character to each of the data subrecords. In addition, the system can comprise a transmitting unit S in the first network NW1, which transmitting unit is for example coupled to or integrated in the dividing unit E1 and/or coding unit COD and sends a data record to a receiving unit E2 in the second network NW2. By way of example, the transmitting unit S, the dividing unit E1 and the coding unit COD are part of a device in the first network NW1.

The system comprises a unidirectional communication unit UC for the decoupled transmission of the coded data subrecords from the first network NW1 to the second network NW2. At the receiver in the second network NW2 the system comprises a receiving unit E2 and a restoring unit E3. The receiving unit E2 and the restoring unit E3 may, in particular, be part of a device CD. The receiving unit E2 comprises in particular a decoding unit DEC for decoding the received coded data subrecords, a main memory S1, a background memory S2 and a table T. The main memory S1 can have in particular a limited storage and computing capacity. The decoding unit DEC, the main memory S1, the background memory S2 and the management unit T may be coupled to one another. In particular, the management unit T may also be part of the main memory S1 (not depicted). The management unit T can be understood to be a table. The management unit T is used to manage in particular the storage and interchange of characters and/or correction characters between the main and background memories S1, S2. The restoring unit E3 restores the transferred data record from the decoded data subrecords and provides this data record for further processing in the second network NW2.

The units of the system can each comprise in particular at least one processor that performs the functions. The system can additionally comprise a processor on which a computer program product according to the present invention, comprising program code parts, can run in order to perform the steps of a method according to the present invention in computer-aided fashion.

All of the features described and/or shown can be advantageously combined with one another within the context of the embodiment of the present invention. The present invention is not restricted to the exemplary embodiments described.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for error-correcting transmission of a data record from a first network to a second network via a unidirectional communication unit, the method comprising:
   dividing, by at least one processor, the data record into data subrecords in the first network, wherein a data subrecord comprises at least one respective character;
   coding the data subrecords by adding at least one correction character to each of the data subrecords;
   transmitting, by at least one processor, the characters and correction characters of the coded data subrecords from the first network to a receiving unit in the second network via the unidirectional communication unit;
   receiving, by at least one processor, the characters and correction characters of the coded data subrecords in the second network;
   decoding, by at least one processor, the coded data subrecords, wherein:
   a) characters and correction characters assigned to a first coded data subrecord are stored in a main memory;
   b) characters and correction characters assigned to other coded data subrecords are buffer-stored in a background memory; and
   c) the first coded data subrecord is decoded and subsequently the previously received characters and/or correction characters of one of the other coded data subrecords are moved from the background memory to the main memory;
   wherein steps a) to c) are performed iteratively for each of the coded data subrecords of the data record; and
   restoring, by at least one processor, the data record from the decoded data subrecords in the second network.

2. The method as claimed in claim 1, wherein characters and correction characters of the coded data subrecords are conveyed in each case individually and/or in any order and/or independently of an assignment to one of the coded data subrecords.

3. The method as claimed in claim 1, wherein characters and/or correction characters assigned to a second coded data subrecord are moved from the background memory to the main memory as soon as a complete quantity of characters and/or correction characters for decoding is available in the main memory for the first coded data subrecord stored in the main memory.

4. The method as claimed in claim 1, wherein characters and/or correction characters assigned to a second coded data subrecord are moved from the background memory to the main memory as soon as a larger quantity of characters and/or correction characters is available for the second coded data subrecord than for the first coded data subrecord, wherein the previously received characters and/or correction characters of the first coded data subrecord are moved to the background memory.

5. The method as claimed in claim 1, wherein the received characters and/or correction characters in the second network are managed by means of a management unit and this determines which characters and/or correction characters are stored for a coded data subrecord in the main memory.

6. The method as claimed in claim 5, wherein the management unit is used to ascertain that coded data subrecord for which the largest quantity of received characters and/or correction characters is available, and the characters and/or correction characters of this coded data subrecord are stored in the main memory.

7. The method as claimed in claim 1, wherein the management unit is used to ascertain the quantity of received characters and/or correction characters of a coded data subrecord and to determine from the ascertained quantity the completeness for a decoding of a coded data subrecord.

8. The method as claimed in claim 1, wherein information of the management unit is updated when a character and/or correction character is received in the second network.

9. The method as claimed in claim 1, wherein the coding of the data subrecords in the first network is effected by means of a stipulated forward error correction method.

10. The method as claimed in claim 9, wherein the decoding of the data subrecords in the second network is effected according to the stipulated forward error correction method.

11. A system for error-correcting transmission of a data record from a first network to a second network via a unidirectional communication unit, the system comprising:
   a dividing unit configured to divide the data record in the first network into data subrecords, wherein a data subrecord comprises at least one respective character;
   a coding unit in the first network, configured to code the data subrecords by adding at least one correction character to each of the data subrecords;
   a unidirectional communication unit configured to transmit the characters and correction characters of the coded data subrecords from the first network to a receiving unit in the second network;
   the receiving unit in the second network, configured to receive the characters and correction characters of the coded data subrecords, wherein the receiving unit comprises a main memory, a background memory and a decoding unit for decoding the coded data subrecords, wherein:

a) characters and correction characters assigned to a first coded data subrecord are stored in the main memory;
b) characters and correction characters assigned to other coded data subrecords are buffer-stored in the background memory; and
c) the first coded data subrecord is decoded and subsequently the previously received characters and/or correction characters of one of the other coded data subrecords are moved from the background memory to the main memory;

wherein steps a) to c) are performed iteratively for each of the coded data subrecords of the data record;

and a restoring unit configured to restore the data record from the decoded data subrecords in the second network.

12. The system as claimed in claim 11, comprising a management unit for managing the received characters and/or correction characters in the second network.

13. A computer program product, comprising a non-transitory computer readable hardware storage device having a computer readable program code stored therein, said program code executable by a processor of a computer system to complement the method as claimed in claim 1.

* * * * *